(12) United States Patent
Kim et al.

(10) Patent No.: US 7,451,374 B2
(45) Date of Patent: Nov. 11, 2008

(54) APPARATUS AND METHOD FOR CHANNEL CODING IN MOBILE COMMUNICATION SYSTEM

(75) Inventors: Nam-Shik Kim, Seoul (KR);
Hyun-Cheol Park, Daejeon (KR);
Seung-Bum Suh, Seoul (KR);
Eoi-Young Choi, Seoul (KR)

(73) Assignee: Samsung Electronics Co., Ltd (KR)

( * ) Notice: Subject to any disclaimer, the term of this patent is extended or adjusted under 35 U.S.C. 154(b) by 497 days.

(21) Appl. No.: 11/190,543

(22) Filed: Jul. 27, 2005

(65) Prior Publication Data

US 2006/0026488 A1 Feb. 2, 2006

(30) Foreign Application Priority Data

Jul. 27, 2004 (KR) .................. 10-2004-0058749

(51) Int. Cl.
*H04L 1/779* (2006.01)
(52) U.S. Cl. ............... 714/748; 714/758; 714/800
(58) Field of Classification Search ............. 714/748, 714/751, 754, 758, 779, 786, 794, 800
See application file for complete search history.

(56) References Cited

U.S. PATENT DOCUMENTS 6,611,212 B1 *  8/2003  Craven et al. ............. 341/50
7,162,684 B2 *  1/2007  Hocevar .................... 714/800
2008/0016433 A1 *  1/2008  Stolpman ................... 714/786

FOREIGN PATENT DOCUMENTS

EP    1 422 829    5/2004

OTHER PUBLICATIONS

Deepak Sridhara et al., Low Density Parity Check Codes from Permutation Matrices, 2001 Conference on Information Sciences and Systems, The Johns Hopkins University, 2001.
Thomas J. Richardsom et al., Efficient Encoding of Low-Density Parity-Check Codes, IEEE Transactions on Information Theory, vol. 47, No. 2, Feb. 2001.
Hao Zhong et al., Joint Code-Encoder-Decoder Design for LDPC Coding System VLSI Implementation, 2004.

\* cited by examiner

*Primary Examiner*—Mujtaba K. Chaudry
*Assistant Examiner*—Fritz Alphonse
(74) *Attorney, Agent, or Firm*—The Farrell Law Firm, PC

(57) ABSTRACT

Disclosed are an apparatus and a method for reducing the coding complexity in an LDPC code used in a digital communication system. In the method, parameters required for coding are determined according to a coding rate and a code length, a seed matrix is generated according to values of the parameters, a plurality of cell matrices are generated according to the values of the parameters, a parity check matrix is generated using the seed matrix and the cell matrix, and information bits are coded from the parity check matrix. The method can be realized by a small memory and a simple shift register and can perform coding even without obtaining a generation matrix, thereby remarkably reducing the complexity of a system.

14 Claims, 8 Drawing Sheets

$$R_1 = \begin{bmatrix} 0 & 0 & 0 & 1 \\ 1 & 0 & 0 & 0 \\ 0 & 1 & 0 & 0 \\ 0 & 0 & 1 & 0 \end{bmatrix} \quad R_2 = \begin{bmatrix} 0 & 0 & 0 & 1 \\ 0 & 0 & 1 & 0 \\ 0 & 1 & 0 & 0 \\ 1 & 0 & 0 & 0 \end{bmatrix} \quad R_3 = \begin{bmatrix} 1 & 0 & 0 & 0 \\ 0 & 0 & 0 & 1 \\ 0 & 0 & 1 & 0 \\ 0 & 1 & 0 & 0 \end{bmatrix} \quad R_4 = \begin{bmatrix} 0 & 1 & 0 & 0 \\ 1 & 0 & 0 & 0 \\ 0 & 0 & 0 & 1 \\ 0 & 0 & 1 & 0 \end{bmatrix} \quad R_5 = \begin{bmatrix} 0 & 1 & 0 & 0 \\ 0 & 0 & 1 & 0 \\ 0 & 0 & 0 & 1 \\ 1 & 0 & 0 & 0 \end{bmatrix} \quad R_6 = \begin{bmatrix} 1 & 0 & 0 & 0 \\ 0 & 1 & 0 & 0 \\ 0 & 0 & 1 & 0 \\ 0 & 0 & 0 & 1 \end{bmatrix}$$

FIG. 3

APPARATUS AND METHOD FOR CHANNEL CODING IN MOBILE COMMUNICATION SYSTEM

PRIORITY

This application claims priority to an application entitled "Apparatus and Method for Channel Coding in Mobile Communication System" filed in the Korean Intellectual Property Office on Jul. 27, 2004 and assigned Serial No. 2004-58749, the contents of which are hereby incorporated by reference.

BACKGROUND OF THE INVENTION

1. Field of the Invention

The present invention relates to an apparatus and a method for channel coding in a mobile communication system, and more particularly to an apparatus and a method for a Low Density Parity Check (LDPC) channel coding in a mobile communication system.

2. Description of the Related Art

Generally, data may be lost due to channel state errors caused by noise, interference and fading when voice and data are transmitted in a wireless mobile communication system. In order to prevent data from being lost, a mobile communication system uses error control techniques. The basic error control technique uses an error control code.

A turbo code and an LDPC code are representative codes of the error control code. The LDPC code not only has a low decoding complexity and can perform a high speed processing through parallel processing, but also exhibits superior performance that can reach the Shannon limit. Accordingly, extensive research is being conducted on the LDPC code as a code suitable for the next generation mobile communication systems.

The LDPC code has been first proposed by Gallager in 1962, but it was not realized by technology of those days even though it exhibits superior performance. The LDPC codes have been rediscovered recently and proved its superior performance with a simple probability decoding method.

The LDPC code is defined by a parity check matrix. The parity check matrix is a matrix in which most of the elements are '0's, which plays a role in determining if received coded signals include errors. Further, the parity check matrix divides an entire parity check matrix into a plurality of partial blocks and allows a permutation matrix to correspond to each of the partial blocks.

The parity check matrix is constructed by a regular method and an irregular method. In the parity check matrix constructed by the regular method, each row and each column have constant weights. However, in the parity check matrix constructed by the irregular method, each row and each column do not have constant weights. The weight represents the number of '1's included in the matrix. In general, the parity check matrix constructed by the irregular method exhibits relatively superior performance or compared to that of the parity check matrix constructed by the regular method. However, because the weights are not constant in the parity check matrix constructed by the irregular method, the weights of each row and each column in the parity check matrix must be properly adjusted in order to ensure superior performance.

FIG. 1A is a diagram illustrating a structure of a parity check matrix of a (3, 6) LDPC code having a coding rate of ½ according to the regular method, and FIG. 1B is a diagram illustrating a parity check matrix when a code length is 1000 bits in FIG. 1A.

The (3, 6) LDPC code represents that six '1's exist in each row and three '1's exists in each column in the parity check matrix.

Referring to FIG. 1A, the parity check matrix includes an information word part 101 mapped with an information word and a parity part 103 mapped with a parity. The numbers '3' within a circle circulating in each of the parts 101 and 103 represent that three '1's exist in each row and each column in the parity check matrix. Because a coding rate of the LDPC code is ½, the information word part 101 must have the same size as that of the parity part 103 in the parity check matrix. A structure of a parity check matrix having a code length of 1000 bits is shown in FIG. 1B.

In a general coding process for an LDPC code, a generation matrix is formed from the parity check matrix, and the data to be transmitted is coded by the generation matrix.

The generation matrix is generated from the parity check matrix by Gaussian elimination. The parity check matrix must satisfy the condition that a multiplication with a received coded signal is '0'. Accordingly, the parity check matrix is formed to satisfy the condition as described above. Then, a coding process is performed through matrix multiplication between the data to be transmitted and the generation matrix.

The LDPC code may be expressed on a factor graph. If the LDPC code is expressed on the factor graph, a cycle exists on the factor graph. Iterative decoding on the factor graph in which the cycle exists is sub-optimum in performance. The fact that the LDPC code has superior performance through the iterative decoding has also been experimentally proved. However, when many cycles having short lengths exist on the factor graph, performance of the LDPC code deteriorates due to an error floor. Accordingly, it is preferred to design an LDPC code in which the cycles having the short lengths do not exist on the factor graph.

As described above, the generation matrix is used for the LDPC coding. Because the generation matrix is generated by Gaussian elimination, the number of '1's increases in the generation matrix. An increase in the number of '1's may increase coding complexity for the LDPC code.

In order to solve the above-mentioned problems, various coding methods have been proposed. From among the coding methods, a representative method is a method for minimizing an operation proportional to a square in an operation of restructuring a parity check matrix. However, a coding method capable of remarkably reducing the coding complexity has not yet been developed. Accordingly, it is necessary to develop an LDPC coding method capable of reducing the coding complexity and simultaneously achieving superior performance.

SUMMARY OF THE INVENTION

Accordingly, the present invention has been made to solve at least the above-mentioned problems occurring in the prior art, and it is an object of the present invention to provide an apparatus and a method for coding which can efficiently generate an LDPC code.

It is another object of the present invention to provide an apparatus and a method for coding which can remarkably reduce system complexity in generating an LDPC code.

It is further another object of the present invention to provide an apparatus and a method for coding which can directly perform coding without calculating a generation matrix from a parity check matrix in an LDPC coding method.

It is still another object of the present invention to provide a method for coding for improving decoding performance by eliminating a short cycle deteriorating the decoding performance in forming a parity check matrix.

It is yet another object of the present invention to provide a method capable of generating an irregular LDPC code through a simple change in a system in forming a parity check matrix.

In order to accomplish the aforementioned object, according to one aspect of the present invention, there is provided a method for generating a parity check matrix of a Low Density Parity Check (LDPC) code including an information word part, a first parity part and a second parity part, the method including the steps of determining parameters required for coding according to a coding rate and a code length; generating a seed matrix according to values of the parameters; generating a plurality of cell matrices according to the values of the parameters; placing the generated cell matrices in place of '1's from among elements of the seed matrix; and placing zero matrices in place of '0's from among the elements of the seed matrix, each of the zero matrices having a size equal to a size of the cell matrix.

In order to accomplish the aforementioned object, according to another aspect of the present invention, there is provided a Low Density Parity Check (LDPC) coding apparatus for operating a first parity bit sequence by means of an information word bit sequence and generating a second parity bit sequence by means of the information word bit sequence and the first parity bit sequence in a coding apparatus which inputs the information word bit sequence and generates the first parity bit sequence and the second parity bit sequence by means of the information word bit sequence, the information word bit sequence including the bit sequence having a length of k, the apparatus including a first cyclic shifter for inputting the information word bit sequence and circularly shifting the information word bit sequence in a unit of k; a second cyclic shifter for inputting the first parity bit sequence determined by the information word bit sequence, and circularly shifting the first parity bit sequence in a unit of k; a plurality of registers for changing the order of the information word bit sequence and the first parity bit sequence according to a set pattern while allowing elements of '1's to correspond to a first row of a parity check matrix; an adder for adding output values from the registers in a unit of a bit; a second parity register for changing an order of an output bit sequence of the adder, thereby obtaining the second parity bit sequence; and a third cyclic shifter for inputting the second parity bit sequence, which is an output bit sequence of the second parity register, and circularly shifting the second parity bit sequence in a unit of k, wherein the first parity bit sequence input to the second cyclic shifter and the second parity bit sequence input to the third cyclic shifter are circularly shifted in a unit of k.

In order to accomplish the aforementioned object, according to further another aspect of the present invention, there is provided a Low Density Parity Check (LDPC) coding method for operating a first parity bit sequence by means of an information word bit sequence and generating a second parity bit sequence by means of the information word bit sequence and the first parity bit sequence in a coding method which inputs the information word bit sequence and generates the first parity bit sequence and the second parity bit sequence by means of the information word bit sequence, the information word bit sequence including the bit sequence having a length of k; the method including the steps of inputting the information word bit sequence to a first cyclic shifter; inputting the first parity bit sequence determined by the information word bit sequence to a second cyclic shifter; changing, by a plurality of registers, the order of the information word bit sequence and the first parity bit sequence according to a set pattern, which correspond to elements of '1's of a first row in a parity check matrix; adding the information word bit sequence and the first parity bit sequence, which have changed orders, in a unit of a bit; changing an order of the added bit sequence according to a set pattern, thereby obtaining the second parity bit sequence; inputting the second parity bit sequence to a third cyclic shifter; and circularly and simultaneously shifting the first cyclic shifter in a unit of k after the second parity bit sequence is input to the third cyclic shifter, and circularly shifting the second cyclic shifter and the third cyclic shifter in a unit of k.

BRIEF DESCRIPTION OF THE DRAWINGS

The above and other objects, features and advantages of the present invention will be more apparent from the following detailed description taken in conjunction with the accompanying drawings, in which:

FIG. 1B is a diagram illustrating a check matrix of a regular random LDPC code designed by an LDPC code generation method of FIG. 1a;

FIG. 3 is a diagram of cell matrices according to a preferred embodiment of the present invention;

DETAILED DESCRIPTION OF THE PREFERRED EMBODIMENT

A preferred embodiment of the present invention will be described in detail herein below with reference to the accompanying drawings.

The following description for the present invention describes in detail a coding apparatus and method for a Low Density Parity Check (LDPC) code which is an error control code used in a mobile communication system. A method will be described, which generates a parity check matrix by means of a seed matrix, which is a cyclic matrix of a short length, and a cell matrix which is a square matrix substituted for each element block of the seed matrix. Further, an apparatus and a method will also be described, which encodes an input information word bit sequence by means of the generated parity check matrix. It is apparent to one skilled in the art that it is easy to expand the embodiments of the present invention described in this specification even though code lengths and coding rates are different.

A. Construction of a Parity Check Matrix

The parity check matrix proposed by the present invention includes a seed matrix and a cell matrix. In order to form the seed matrix and the cell matrix, parameters n, m and k must be determined. Herein, n represents a column length of the seed matrix, m represents a row length of the seed matrix, and k represents a size of the cell matrix which is an (k×k) square matrix. The coding rate is defined as a value of (n−m)/n and the code length is defined as a value of nk. Accordingly, the coding rate may be expressed by Equation 1 and the code length may be expressed by Equation 2.

$$\text{coding rate} = (n-m)/n \qquad (1)$$

$$\text{code length} = nk \qquad (2)$$

Because the coding rate and the code length are known, multiple values of the parameters (i.e. n, m and k) satisfying Equations 1 and 2 exist. From among the multiple parameters, an optimal parameter for forming the parity check matrix is selected. Further, sizes of the (m×n) seed matrix and the (k×k) cell matrix are determined by the selected parameters n, m and k.

In the embodiment of the present invention, a (3, 6) LDPC code in which a coding rate is ½ and a code length is 200 will be described in detail. From among the parameters satisfying Equations 1 and 2, n, m and k are selected as 50, 25 and 4 respectively. Accordingly, the (25×50) seed matrix and the (4×4) cell matrix are formed.

Figure 1A:
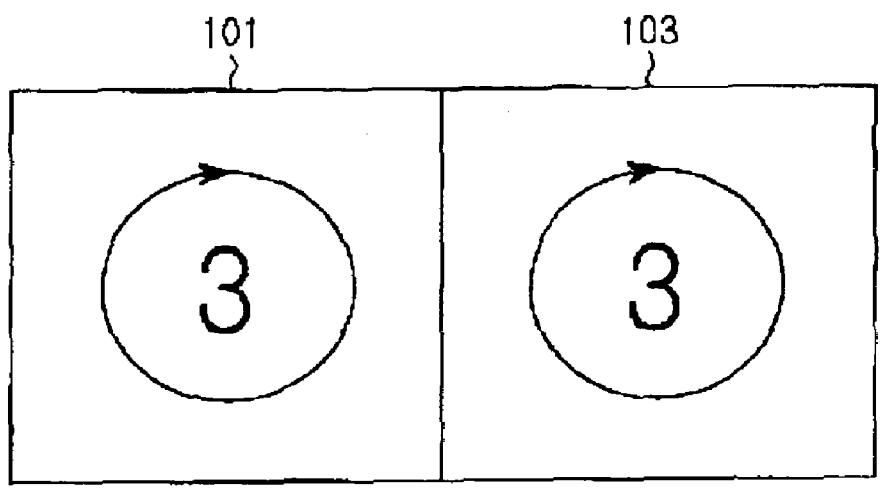
FIG. 1A is a diagram illustrating a structure of a conventional LDPC code having a coding rate of ½.
Figure 1B:
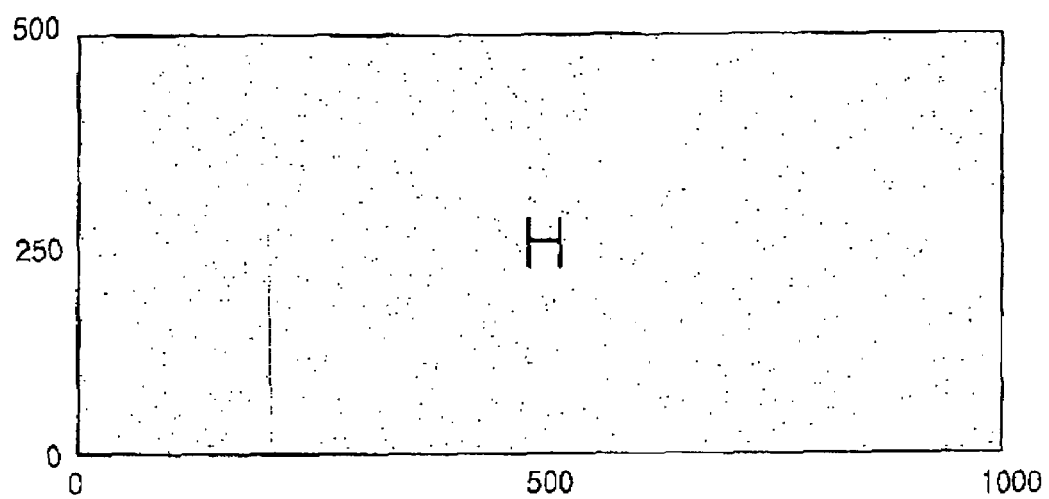
Figure 2A:
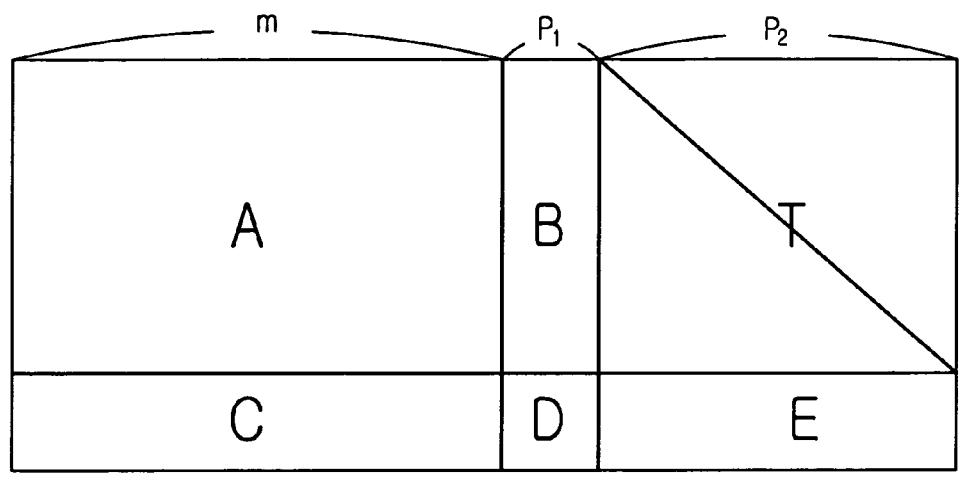
FIG. 2A is a diagram of a parity check matrix divided by six partial block matrices.
Figure 2B:
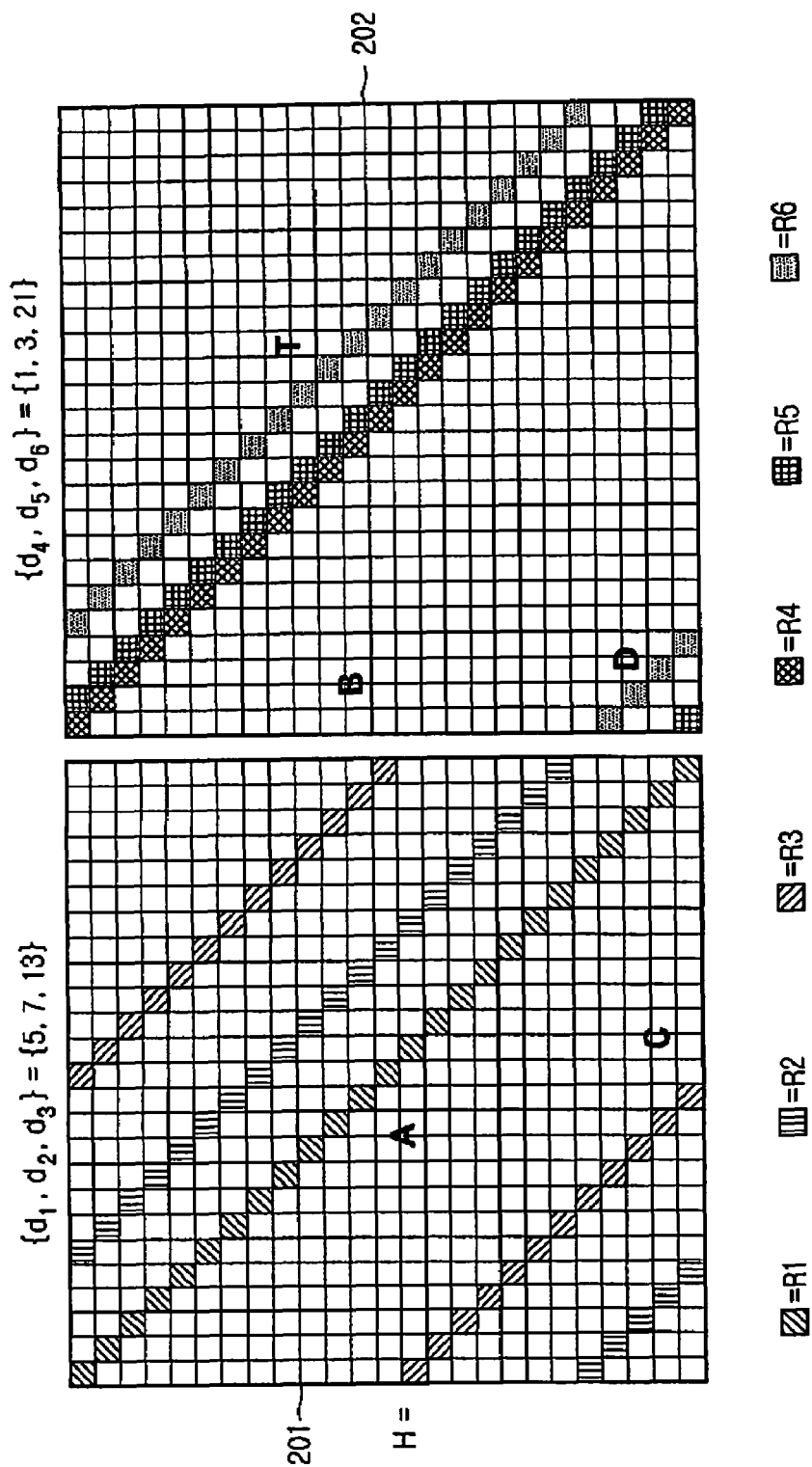
FIG. 2B is a diagram of blocks in a seed matrix according to a preferred embodiment of the present invention.

FIG. 2A is a diagram of a parity check matrix divided into six partial block matrices and FIG. 2B is a diagram of blocks in the seed matrix according to the preferred embodiment of the present invention.

As illustrated in FIG. 2A, the parity check matrix includes an information word part m corresponding to an information word bit sequence, a part P1 corresponding to a first parity bit sequence, and a part P2 corresponding to a second parity bit sequence. The information part m is divided into two blocks A and C, the part P1 is divided into two blocks B and D, and the part P2 is divided into two blocks T and E.

The seed matrix proposed in the present invention has a shape of the parity check matrix in FIG. 2B. Referring to FIG. 2B, the seed matrix includes two square matrices each of which has 25 row blocks and 25 column blocks. The two square matrices are a first square matrix 201 corresponding to the information word part m and a second square matrix 202 corresponding to the parity part. As illustrated in FIG. 2B, the first square matrix 201 is divided into two block matrices A and C. In the second square matrix 202, the part P1 is divided into two block matrices B and D, and the part P2 is divided into two block matrices T and E. The R1 to R6 represent the location of '1's in the seed matrix. Further, the R1 to R6 represent cell matrices which will be described later.

Hereinafter, a method for generating the seed matrix will be described.

First, the (25×50) matrix is formed according to the codeword length of 200 and the coding rate of ½, and the matrix is divided into two (25×25) square matrices as described above. From among the square matrices, the matrix corresponding to the information word part is the first square matrix 201 and the matrix corresponding to the parity part is the second square matrix 202. Further, because each row and each column have weights of 6 and 3 in the LDPC code respectively, the square matrices 201 and 202 must have weights of 3 and 3, respectively.

According to a method for generating the first square matrix 201 and the second square matrix 202, the distance between the three elements of '1's is determined in a first row by a preset method in order to eliminate four cycles in each of the square matrices 201 and 202. Then, each of the elements of '1's is diagonally arranged.

A method for determining the distance between the elements of '1's in each of the generated square matrices 201 and 202 is as follows.

First, in the matrix in which the distance between the elements of '1's is constant, when the distance between the elements of '1's in each row is d, the square matrix may be expressed by a set $\{d_1, d_2, \ldots, d_k\}$.

Because the distance between the elements of '1's is constant in each row, sets $\{d_1^{(1)}, d_2^{(1)}, d_3^{(1)}\}$ and $\{d_1^{(2)}, d_2^{(2)}, d_3^{(2)}\}$ may be expressed in the first square matrix 201 and the second square matrix 202, respectively. When the elements of each set are constructed in an incremental sequence, four cycles are eliminated from the square matrices 201 and 202. The incremental sequence represents a sequence satisfying Equation 3 when the set is given as $\{d_1, d_2, \ldots, d_k\}$.

$$K=0: 2d_1\, d_2, d_1 < d_2$$

$$K>1: 2d_{k+1}\, d_{k+2}, d_k + d_{k+1} < d_{k+2} \text{ for any } k=1, 2, \qquad (3)$$

In Equation 3, k denotes integer numbers greater than '0'.

Four cycles are eliminated from a set satisfying Equation 3. Herein, a square matrix satisfying the condition is defined as an Incremental Distance Cyclic Matrix (IDCM) and expressed by an IDCM[$d_1, d_2, \ldots, d_k$]. Accordingly, the first square matrix 201 and the second square matrix 202 satisfying Equation 3 may be expressed by an IDCM[5, 7, 13] and an IDCM[1, 3, 21], respectively.

Then, the seed matrix is generated by combining the first square matrix 201 with the second square matrix 202, which satisfy Equation 3. In the seed matrix obtained by combining the square matrices 201 and 202, four cycles are eliminated. This is because four cycles are also eliminated in the matrix obtained by combining two matrices, on condition that the sums of the elements in the two IDCMs are equal while the two IDCMs are disjointed.

The expression "two IDCM[$d_1^{(1)}, d_2^{(1)}, d_3^{(1)}$] and IDCM[$d_1^{(2)}, d_2^{(2)}, d_3^{(2)}$] are disjointed" refers to a case where the two integer distance sets are satisfied the following three conditions:

$$\sum d_k^{(1)} = \sum d_k^{(2)} = n \qquad 8)$$

$$\text{If } D^{(i)} = \{d_1^{(i)}, d_2^{(i)}, d_3^{(i)}, n-d_1^{(i)}, n-d_2^{(i)}, n-d_3^{(i)}\} \text{ for } i=1, \qquad 9)$$
$$2, \text{ then } D^{(1)} \cap D^{(2)} = \phi$$

$$\text{If } S^{(i)} = \{x = D_1 \pm D_2 | 0 < x < n, D_1, D_2 \in D^{(i)}\} \text{ for } i=1, \qquad 10)$$
$$2, \text{ then } D^{(1)} \cap S^{(2)} = \phi \text{ and } D^{(2)} \cap S^{(1)} = \phi$$

Hereinafter, a method for generating the cell matrix will be described.

FIG. 3 is a diagram of the cell matrices according to the preferred embodiment of the present invention.

In the embodiment of the present invention, because six '1's exist in one row of the seed matrix, six cell matrices each of which has a size of (4×4) are required.

Referring to FIG. 3, in each of the cell matrices, each row and each column include only one element of '1'. When a matrix satisfying both Equations 4 and 5 below is formed for '1's in the cell matrices, six cycles are eliminated from the cell matrix.

$$w_H[\text{diag}(R_1 \cdot R_3^T \cdot R_2 \cdot R_1^T \cdot R_3 \cdot R_2^T)] = 0 \qquad (4)$$

$$w_H[\text{diag}(R_5 \cdot R_4^T \cdot R_6 \cdot R_5^T \cdot R_4 \cdot R_6^T)] = 0 \qquad (5)$$

In Equations 4 and 5, R represents a cell matrix, $W_H$ represents a Hamming weight function indicating the number of elements other than '0', diag represents a diagonal function indicating elements in a diagonal of a matrix In a cell matrix that satisfies the conditions, an order of input data is relocated when a matrix multiplication is performed for the input data. For example, when a matrix multiplication is performed for the matrix R1 of FIG. 3 and random data [a b c d], data [d a b c] having a changed order are output.

When the seed matrix and the cell matrix are generated according to the embodiment of the present invention, the parity check matrix is generated placing the cell matrix (square matrix) in place of '1's in the seed matrix and placing a zero matrix having the same size as that of the cell matrix in place of remaining '0's.

In the parity check matrix generated by the method as described above, four cycles and six cycles are eliminated due to characteristics of the seed matrix and the cell matrix. Accordingly, the LDPC code according to the present invention can prevent system performance from deteriorating due to a short cycle.

B. LDPC Coding Method

Figure 4:
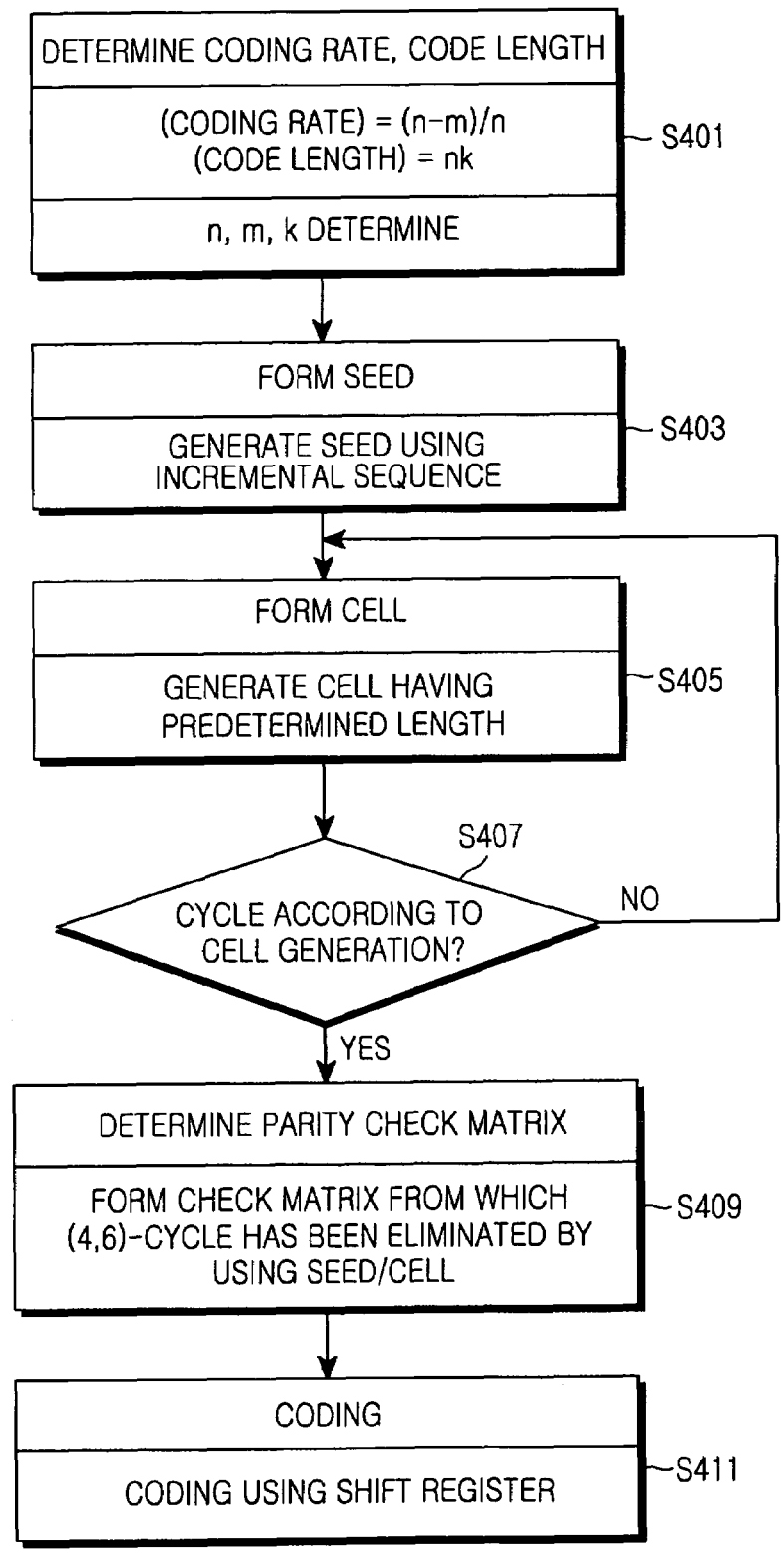
FIG. 4 is a flow diagram illustrating a coding method for an LDPC code according to the present invention.

FIG. 4 is a flow diagram illustrating a coding method for the LDPC code according to the present invention.

Referring to FIG. 4, in step 401, the parameters n, m and k are determined using a coding rate and a code length. When the parameters are determined, sizes of the seed matrix and the cell matrix are also determined. In step 403, a seed matrix from which four cycles have been eliminated is generated from the seed matrix having the determined size by means of an incremental sequence. The incremental sequence has already been described. When the size of the cell matrix is determined by the parameters, a cell matrix from which six cycles have been eliminated is generated by the above-described method in step 405. In step 407, whether or not the six cycles have been eliminated from the generated cell matrix is determined. When the six cycles have not been eliminated, the cell matrix must be formed again. However, when the six cycles have been eliminated, the parity check matrix is generated by placing the cell matrix in place of '1's in the seed matrix and placing a zero matrix having the same size as that of the cell matrix in place of remaining '0's, in step 409. In the parity check matrix generated by the method, four cycles and six cycles are eliminated. In step 411, because the distance between the elements of '1's is constant and the elements are diagonally arranged after being shifted by one block in the generated parity check matrix, it is possible to easily perform coding for data to be transmitted by means of a shift register.

C. LDPC Coding Apparatus and Method

Figure 5:
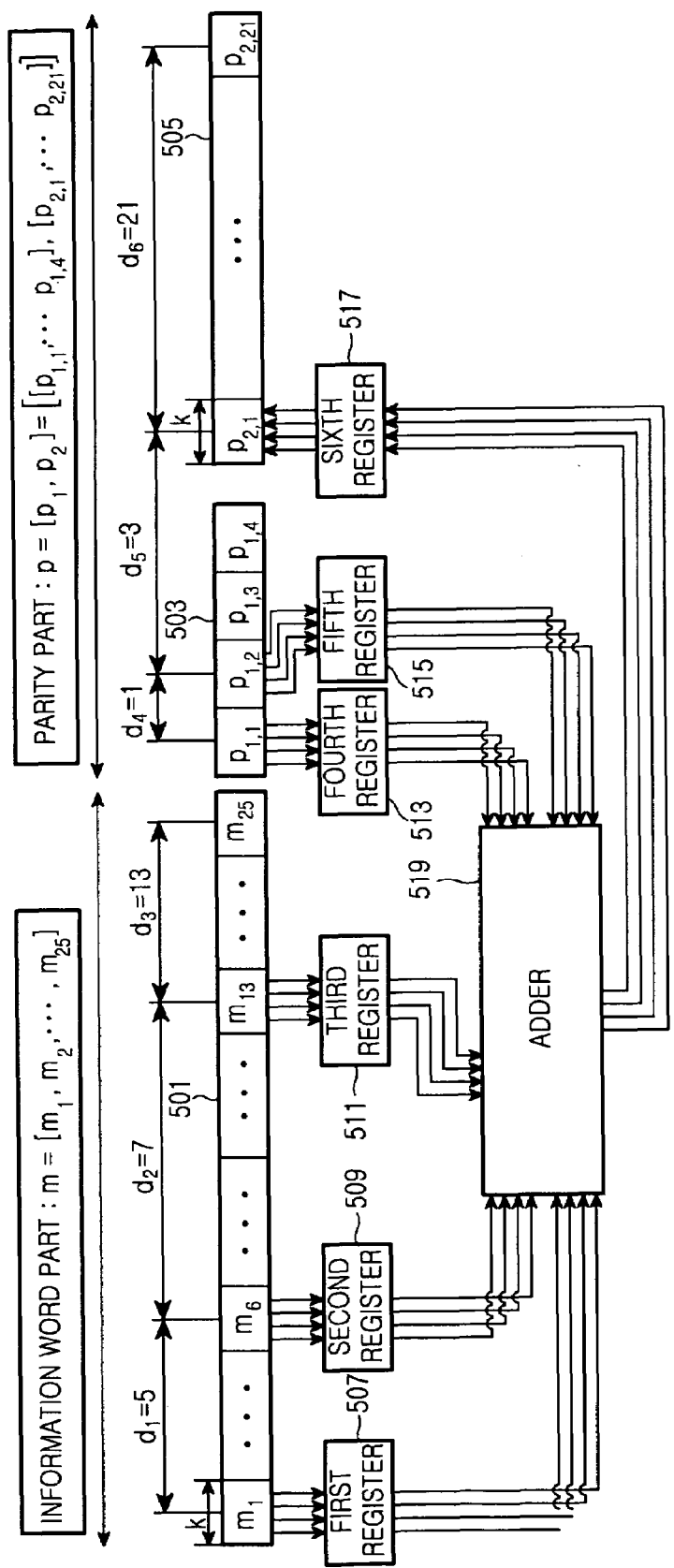
FIG. 5 is a block diagram illustrating a coding apparatus according to a preferred embodiment of the present invention.
Figure 6:
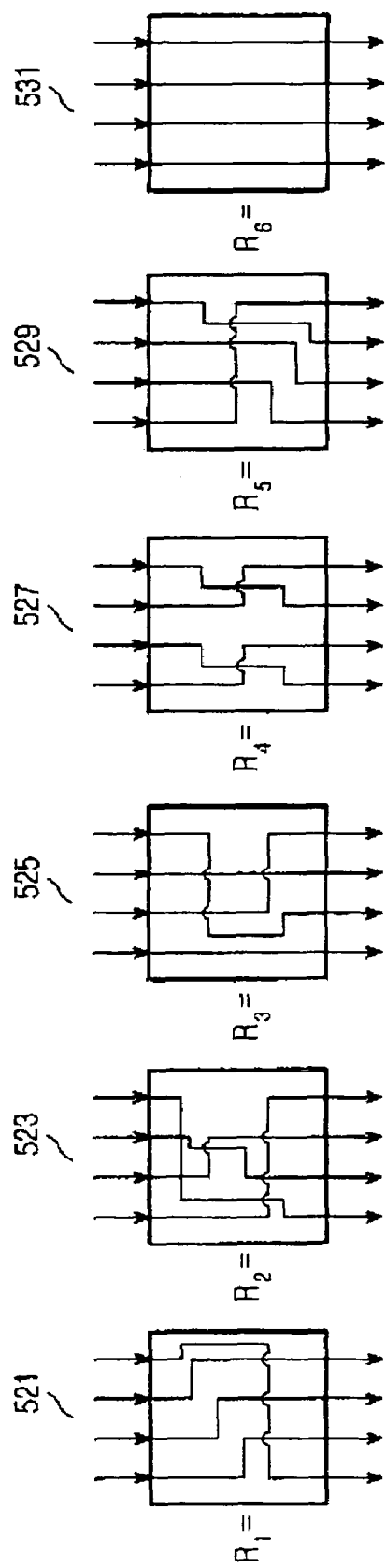
FIG. 6 is a diagram illustrating an embodiment of a register in FIG. 5.

FIG. 5 is a block diagram illustrating the coding apparatus according to the preferred embodiment of the present invention, and FIG. 6 is a diagram illustrating an embodiment of the register in FIG. 5.

Before describing FIG. 5, the coder according to the embodiment of the present invention is an embodiment of the parity check matrix. The coder has been realized based on the conditions that a codeword length is 200 bits, a coding rate is ½, an information word length is 100 bits, and a parity bit is 100 bits. Because the information word length is calculated by a multiplication of a row length of the seed matrix and a row length of the cell matrix, information word bit sequences includes 25 bit sequences and each of the bit sequences includes four bit sequences. The information word bit sequences, first parity bit sequences and second parity bit sequences may be expressed by $m=[m_1, \ldots, m_{25}]$, $P_1=[P_{1,1}, \ldots, P_{1,4}]$ and $P_2=[P_{2,1}, \ldots, P_{2,21}]$, respectively. Further, the codeword having a length of 200 bits output from the coder may be expressed by $C=[m_1 \ P_1 \ P_2]$. Herein, each of the bit sequences is constructed by four bits. Because the coding rate is ½, the sum of the length of the first parity and the length of the second parity must coincide with the length of the information word bit sequences.

Referring to FIG. 5, the coder of the LDPC code includes a first cyclic shifter 501 for inputting the information word bit sequences, a second cyclic shifter 503 for inputting the first parity bit sequences, a third cyclic shifter 505 for inputting the second parity bit sequences, registers 507 to 517 (embodiment of the cell matrix) which change orders of the input bit sequences by a predetermined method, and an adder 519 for adding output bit sequences form the registers 507 to 517. The registers 507 to 517 are disposed with an interval corresponding to the distance d between the elements of '1's in the first row of the seed matrix. In the seed matrix according to the embodiment of the present invention, because the distances between the elements of '1's are 5, 7, 13, 1, 3, 21, the registers 507 to 517 are disposed with the distances between the elements of '1's in FIG. 5.

The first cyclic shifter 501 inputs the information word bit sequences and circularly shifts the information word bit sequences by four bits (size of the cell matrix). The second cyclic shifter 503 and the third cyclic shifter 505 circularly shifts the first parity bit sequences and the second parity bit sequences by four bits, respectively.

In the coding method according to the coding apparatus, the information word bit sequences $m=[m_1, \ldots, m_{25}]$ are input to the first cyclic shifter 501 by the four bits (size of the cell matrix). The bit sequences $m_1$, $m_6$ and $m_{13}$ of the input bit sequences have orders changed by the first cyclic shifter 501, the second cyclic shifter 503 and the third cyclic shifter 505. Further, the first parity bit sequences are obtained from the information word bit sequences by a pre-processor. The pre-processor performs an operation as expressed by Equation 6 proposed by the conventional method.

$$P_1 = (ET^{-1}B+D)^{-1} \cdot (ET^{-1}A+C) \cdot m \quad (6)$$

In Equation 6, m represents the information word bit, and A, B, C, D, E, and T represent partial block matrices in the parity check matrix as described in FIG. 2. Herein, a test equation of the block matrix $$\begin{pmatrix} B & T \\ D & E \end{pmatrix}$$

and the block matrix T should not be zero.

The first parity bit sequences $P_1=[P_{1,1}, \ldots, P_{1,4}]$ obtained by the pre-processor are input to the second cyclic shifter 503, and the bit sequences $P_{1,1}$ and $P_{1,2}$ of the input bit sequences have orders changed by the fourth register 513 and the fifth register 515. The register is an embodiment of the cell matrix, which will be described with reference to FIG. 6.

The bit sequences output from the first register 507 to the fifth register 515 are added by the adder 519. Further, bit sequences output from the adder 519 have orders changed by the sixth register 517, so that a first column $P_{2,1}$ is obtained from among the second parity bit sequences. That is, the first column $P_{2,1}$ may be obtained by Equation 7.

$$P_{2,1} = R_6^{-1} \cdot (R_1 \cdot m_1 + R_2 \cdot m_6 + R_3 \cdot m_{13} + R_4 \cdot P_{1,1} + R_5 \cdot P_{1,3}) \quad (7)$$

In Equation 7, $R_1$ to $R_6$ represent the generated cell matrix. Further, the $R_1$ to $R_6$ represent the first register 507, the second register 509, the third register 511, the fourth register 513, the fifth register 515 and the sixth register 517 in FIG. 5.

After obtaining the first column $P_{2,1}$, the bit sequences input to the first cyclic shifter 501 are circularly shifted leftward by four bits (size k of the cell matrix), the bit sequences input to the second cyclic shifter 503 are circularly shifted leftward by four bits, and the bit sequences input to the third cyclic shifter 505 are circularly shifted leftward by four bits. The method is repeated, so that $P_{2,2}$ can be obtained. In this way, the second parity bit sequences $P_2=[P_{2,1}, \ldots, P_{2,21}]$ can be obtained.

Hereinafter, the register will be described, which is an embodiment of the cell matrix.

In FIG. 6, $R_1$ 521, $R_2$ 523, $R_3$ 525, $R_4$ 527, $R_5$ 529 and $R_6$ 531 indicate the first register to the sixth register in FIG. 5, respectively. In the embodiment of the present invention, the cell plays a role in relocating orders of the input bit sequences as described above, so that $R_1$ to $R_6$ can be easily realized. For example, in FIG. 6, $R_1$ 521 is a register which outputs a first bit to the location of a second bit, outputs the second bit to the location of a third bit, outputs the third bit to the location of a fourth bit, and outputs the fourth bit to the location of the first bit. Because the register (embodiment of the cell matrix) has only to change the locations of the input bits as described above, the register can be easily realized. In obtaining the second parity bit sequences, the sixth register must obtain an inverse matrix as expressed by Equation 5. When the sixth register is generated with an identity matrix, the system can be realized more simply. Herein, because the sixth register performs an operation for obtaining the second parity bit sequences, it will be referred to as a second parity register.

According to the present invention as described above, in coding an LDPC code, the coding can be performed with only a parity check matrix without obtaining a generation matrix. Further, in realizing the parity check matrix according to the present invention, a coder can be realized with only the memory required for realizing a pre-processor for operating a first parity vector and with only a simple shift register such as a cell matrix. Therefore, the complexity of an LDPC coder can be remarkably reduced.

According to the present invention as described above, in coding an LDPC code, it is not necessary to realize a generation matrix, and a seed matrix and a cell matrix required for generating a parity check matrix can be realized with simple registers. Accordingly, it is possible to efficiently design a coder capable of remarkably reducing the complexity of a system.

Further, according to the present invention as described above, a parity check matrix is constructed by a seed matrix from which four cycles are eliminated and a cell matrix from which six cycles are eliminated. Therefore, system performance can be improved.

Generally, a parity check matrix is generated by a regular method in order to easily realize a system. However, according to the present invention as described above, only a cell matrix changes in a regular parity check matrix, so that an irregular LDPC code can also be easily generated. Therefore, system performance can again be improved.

While the present invention has been shown and described with reference to certain preferred embodiments thereof, it will be understood by those skilled in the art that various changes in form and details may be made therein without departing from the spirit and scope of the present invention as defined by the appended claims.

What is claimed is:

1. A method for generating a parity check matrix of a Low Density Parity Check (LDPC) code including an information word part, a first parity part and a second parity part, the method comprising the steps of:
    determining parameters required for coding according to a coding rate and a code length;
    generating a seed matrix according to values of the parameters;
    generating a plurality of cell matrices according to the values of the parameters;
    placing the generated cell matrices in place of '1's from among elements of the seed matrix; and
    placing zero matrices in place of '0's from among the elements of the seed matrix, each of the zero matrices having a size equal to a size of the cell matrix.

2. The method as claimed in claim 1, wherein the value of the parameter includes a number of rows, a number of columns and weights in the seed matrix, and the size of the cell matrix.

3. The method as claimed in claim 1, wherein the step of generating the seed matrix comprises the steps of:
    constructing at least two square matrices;
    determining the distance between '1's from among elements of a first row in each of the square matrices; and
    circularly shifting in sequence subsequent rows of the square matrix in which the distance between the '1's has been determined.

4. The method as claimed in claim 3, wherein the two square matrices include a matrix mapped with an information word bit and a matrix mapped with a parity.

5. The method as claimed in claim 3, wherein the step of determining the distance between the '1's comprises the steps of:
    constructing the distance between the '1's in an incremental sequence; and
    disjointing the square matrices constructed in the incremental sequence and eliminating four cycles from the seed matrix.

6. The method as claimed in claim 5, wherein the incremental sequence satisfies the following equation when k is an integer greater than '0'

$$2d_1 \neq d_2, d_1 < d_2 \ k=0$$

$$2d_{k+1} \neq d_{k+2}, d_k + d_{k+1} < d_{k+2} \ k>1.$$

7. The method as claimed in claim 1, wherein the step of generating the cell matrix comprises the steps of:
    constructing square matrices; and
    eliminating six cycles from the square matrices.

8. The method as claimed in claim 7, wherein the step of eliminating the six cycles from the square matrices satisfies $$w_H[\operatorname{diag}(R_1 \cdot R_3^T \cdot R_2 \cdot R_1^T \cdot R_3 \cdot R_2^T)]=0$$

and $$w_H[\operatorname{diag}(R_5 \cdot R_4^T \cdot R_6 \cdot R_5^T \cdot R_4 \cdot R_6^T)]=0$$

where R is the cell matrix, $W_H$ is a Hamming weight function indicating a number of elements other than '0', diag is a diagonal function indicating elements in a diagonal of a matrix.

9. A Low Density Parity Check (LDPC) coding apparatus for operating a first parity bit sequence by means of an information word bit sequence and generating a second parity bit sequence by means of the information word bit sequence and the first parity bit sequence in a coding apparatus which inputs the information word bit sequence and generates the first parity bit sequence and the second parity bit sequence by means of the information word bit sequence, the information word bit sequence operating in a unit of k, wherein k is a length of a bit sequence, the apparatus comprising:
    a first cyclic shifter for receiving the information word bit sequence and circularly shifting the information word bit sequence in a unit of k;

a second cyclic shifter for receiving the first parity bit sequence determined by the information word bit sequence, and circularly shifting the first parity bit sequence in a unit of k;

a plurality of registers for changing the order of the information word bit sequence and the first parity bit sequence while allowing elements of '1's to corresponding to a first row of a parity check matrix;

an adder for adding output values from the registers in a unit of a bit;

a second parity register for changing an order of an output bit sequence of the adder, thereby obtaining the second parity bit sequence; and a third cyclic shifter for receiving the second parity bit sequence, which is an output bit sequence of the second parity register, and circularly shifting the second parity bit sequence in a unit of k, wherein the first parity bit sequence input to the second cyclic shifter and the second parity bit sequence input to the third cyclic shifter are circularly shifted in a unit of k.

10. The apparatus as claimed in claim 9, wherein the registers eliminate six cycles from a codeword of an LDPC code.

11. The apparatus as claimed in claim 9, wherein the second parity register performs an operation of an identity matrix.

12. A Low Density Parity Check (LDPC) coding method for operating a first parity bit sequence by means of an information word bit sequence and generating a second parity bit sequence by means of the information word bit sequence and the first parity bit sequence in a coding method which inputs the information word bit sequence and generates the first parity bit sequence and the second parity bit sequence by means of the information word bit sequence, the information word bit sequence operating in a unit of k, wherein k is a length of a bit sequence, the method comprising the steps of:

inputting the information word bit sequence to a first cyclic shifter;

inputting the first parity bit sequence determined by the information word bit sequence to a second cyclic shifter;

changing by a plurality of registers the order of the information word bit sequence and the first parity bit sequence, which correspond to elements of '1's of a first row in a parity check matrix;

adding the information word bit sequence and the first parity bit sequence in a unit of a bit;

changing an order of the added bit sequence, thereby obtaining the second parity bit sequence;

inputting the second parity bit sequence to a third cyclic shifter; and circularly shifting the first cyclic shifter in a unit of k after the second parity bit sequence is input to the third cyclic shifter, and circularly shifting the second cyclic shifter and the third cyclic shifter in a unit of k simultaneously.

13. The method as claimed in claim 12, wherein the step of changing the order of the information word bit sequence and the first parity bit sequence comprises a step of eliminating six cycles from a codeword of an LDPC code.

14. The method as claimed in claim 12, wherein the step of changing the order of the added bit sequence is performed by an identity matrix.

* * * * *